United States Patent
Chen et al.

(10) Patent No.: US 10,453,653 B2
(45) Date of Patent: Oct. 22, 2019

(54) ENDPOINT DETECTION ALGORITHM FOR ATOMIC LAYER ETCHING (ALE)

(71) Applicant: Tokyo Electron Limited, Tokyo (JP)

(72) Inventors: Yan Chen, Cupertino, CA (US);
Xinkang Tian, Fremont, CA (US);
Jason Ferns, Sunnyvale, CA (US)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 15/453,555

(22) Filed: Mar. 8, 2017

(65) Prior Publication Data

US 2018/0068831 A1    Mar. 8, 2018

Related U.S. Application Data

(60) Provisional application No. 62/382,904, filed on Sep. 2, 2016.

(51) Int. Cl.
| | | |
|---|---|---|
| *H01J 37/32* | (2006.01) | |
| *H01L 21/3065* | (2006.01) | |
| *H01L 21/66* | (2006.01) | |

(52) U.S. Cl.
CPC .. *H01J 37/32009* (2013.01); *H01J 37/32917* (2013.01); *H01J 37/32963* (2013.01); *H01J 37/32972* (2013.01); *H01L 21/3065* (2013.01); *H01L 21/30655* (2013.01); *H01J 2237/334* (2013.01); *H01L 22/26* (2013.01)

(58) Field of Classification Search
None
See application file for complete search history.

(56) References Cited

U.S. PATENT DOCUMENTS

| | | |
|---|---|---|
| 3,059,611 A | 10/1962 | Fury |
| 3,612,692 A | 10/1971 | Kruppa et al. |
| 4,147,435 A | 4/1979 | Habegger |
| 5,014,217 A | 5/1991 | Savage |
| 5,308,414 A | 5/1994 | O'Neill et al. |
| 5,347,460 A | 9/1994 | Gifford et al. |

(Continued)

FOREIGN PATENT DOCUMENTS

| | | |
|---|---|---|
| CN | 101038860 A | 9/2007 |
| CN | 101221891 A | 7/2008 |

(Continued)

OTHER PUBLICATIONS

Combined Chinese Office Action and Search Report dated Mar. 3, 2016 in Chinese Patent Application No. 201380054482.2 (with English translation), 12 pages.

(Continued)

*Primary Examiner* — Stephanie P Duclair
(74) *Attorney, Agent, or Firm* — Oblon, McClelland, Maier & Neustadt, L.L.P.

(57) ABSTRACT

Described herein are architectures, platforms and methods for determining endpoints of an optical emission spectroscopy (OES) data acquired from a plasma processing system. The OES data, for example, includes an absorption—step process, a desorption—step process, or a combination thereof. In this example, the OES data undergoes signal synchronization and transient signal filtering prior to endpoint determination, which may be implemented through an application of a moving average filter.

13 Claims, 5 Drawing Sheets

(56) References Cited

U.S. PATENT DOCUMENTS

| | | | |
|---|---|---|---|
| 5,353,790 A | 10/1994 | Jacques et al. | |
| 5,450,205 A | 9/1995 | Sawin et al. | |
| 5,751,416 A | 5/1998 | Singh et al. | |
| 5,885,472 A * | 3/1999 | Miyazaki | B24B 37/013 216/60 |
| 5,980,767 A | 11/1999 | Koshimizu et al. | |
| 6,060,328 A | 5/2000 | En et al. | |
| 6,081,334 A | 6/2000 | Grimbergen et al. | |
| 6,090,302 A | 7/2000 | Smith, Jr. et al. | |
| 6,132,577 A | 10/2000 | Smith, Jr. et al. | |
| 6,381,008 B1 | 4/2002 | Branagh et al. | |
| 6,535,779 B1 | 3/2003 | Birang et al. | |
| 6,564,114 B1 | 5/2003 | Toprac et al. | |
| 6,582,618 B1 | 6/2003 | Toprac et al. | |
| 6,745,095 B1 | 6/2004 | Ben-Dov et al. | |
| 6,815,653 B2 | 11/2004 | Tsay et al. | |
| 6,830,939 B2 | 12/2004 | Harvey et al. | |
| 6,911,157 B2 | 6/2005 | Edamura et al. | |
| 6,958,484 B2 | 10/2005 | Mitrovic | |
| 6,969,619 B1 * | 11/2005 | Winniczek | G01N 21/73 257/E21.218 |
| 7,241,397 B2 | 7/2007 | Fink et al. | |
| 7,328,126 B2 | 2/2008 | Chamness | |
| 7,334,477 B1 | 2/2008 | Pirkle | |
| 7,591,923 B2 | 9/2009 | Mitrovic et al. | |
| 8,048,326 B2 | 11/2011 | Yue et al. | |
| 8,158,017 B2 | 4/2012 | Hudson | |
| 8,173,451 B1 | 5/2012 | Tian et al. | |
| 8,415,884 B2 | 4/2013 | Chen et al. | |
| 8,416,509 B2 | 4/2013 | Yi et al. | |
| 8,513,583 B2 | 8/2013 | Corke et al. | |
| 8,553,218 B2 | 10/2013 | Tinnemans et al. | |
| 9,200,950 B2 | 12/2015 | Lian et al. | |
| 2002/0029851 A1 | 3/2002 | Edamura et al. | |
| 2003/0132195 A1 | 7/2003 | Edamura et al. | |
| 2004/0104681 A1 | 6/2004 | Mitrovic | |
| 2006/0006139 A1 * | 1/2006 | Johnson | B81C 1/00579 216/60 |
| 2008/0186473 A1 | 8/2008 | Lee | |
| 2009/0280581 A1 | 11/2009 | Hudson | |
| 2011/0139748 A1 * | 6/2011 | Donnelly | H01J 37/32036 216/37 |
| 2011/0174776 A1 | 7/2011 | Kabe et al. | |
| 2012/0085494 A1 | 4/2012 | Uchida et al. | |
| 2012/0175060 A1 | 7/2012 | Hudson et al. | |
| 2013/0016344 A1 | 1/2013 | Bullock et al. | |
| 2013/0141720 A1 | 6/2013 | Park et al. | |
| 2014/0106477 A1 * | 4/2014 | Chen | H01L 22/26 438/9 |
| 2015/0241272 A1 | 8/2015 | Lian et al. | |
| 2016/0314943 A1 * | 10/2016 | Albarede | H01J 37/32082 |

FOREIGN PATENT DOCUMENTS

| | | |
|---|---|---|
| CN | 102282654 A | 12/2011 |
| EP | 0 652 415 A1 | 10/1994 |
| TW | 589659 | 6/2004 |

OTHER PUBLICATIONS

Ventzek, P.L.G., et al., "Formation, Nature, and Stability of the Arsenic-Silicon-Oxygen Alloy for Plasma Doping of Non-Planar Silicon Structures", Applied Physics letters, vol. 105, 2014, pp. 262102-1-262102-5 with cover page.

Combined Taiwanese Office Action and Search Report dated May 25, 2015 in Taiwanese Patent Application No. 102137525 (with English translation), 19 pages.

White, D.A., "Multivariate Analysis of Spectral Measurements for the Characterization of Semiconductor Processes", Dissertation presented Apr. 2002, at Massachusetts Institute of Technology, pp. 1-357.

Goodlin, B.E., "Multivariate Endpoint Detection of Plasma Etching Processes", Dissertation presented Apr. 2002, at Massachusetts Institute of Technology, pp. 1-226.

International Search Report and Written Opinion dated Mar. 19, 2014 in PCT/US2013/065378, 22 pages.

Yue, H.H., et al., "Plasma Etching Endpoint Detection Using Multiple Wavelengths for Small Open-Area Wafers", J. Vac. Sci. Technol. A, vol. 19 No. 1, 2001, pp. 66-75 with cover page.

White, D., et al., "Low-Open Area Endpoint Detection using a PCA based $T^2$ Statistic and Q Statistic on Optical Emission Spectroscopy Measurements", IEEE Transactions on Semiconductor Manufacturing, vol. 13 No. 2, May 2000, pp. 1-30.

Goodlin, B. E., et al.. "Quantitative Analysis and Comparison of Endpoint Detection Based on Multiple Wavelength Analysis", $201^{st}$ Meeting of the Electrochemical Society, International Symposium on Plasma Processing XIV, Abs. 415, May 2002, pp. 1-30.

Chinese Office Action dated Oct. 31, 2016 in Chinese Patent Application No. 201380054482.2 (with English translation), 10 pages.

Japanese Office Action dated Jul. 5, 2016 in Japanese Patent Application No. 2015-537813 (with English translation), 4 pages.

Combined Taiwanese Office Action and Search Report dated Jan. 2, 2018 in Taiwanese Patent Application No. 105137371 (with English translation), 16 pages.

International Search Report and Witten Opinion dated Jan. 31, 2017 in PCT/US2016/062017, 13 pages.

Master's Thesis of Jae-Wook Lee, presented at University of California, Berkeley, Jul. 1, 2000, 69 pages.

Shannon, S., et al., "A Spatially Resolved Optical Emission Sensor Plasma Etch Monitoring" , Appl. Phys. Lett., vol. 71 No. 11, Sep. 1997, pp. 1467-1468.

Selwyn, G.S., "Optical Diagnostic Techniques for Plasma Processing", AVS Press, 1993, Relevant chapter 3 on Optical Emission Spectroscopy (OES) is provided, pp. 26-80 with title and bibliographic information pages.

International Search Report and Written Opinion dated Jan. 29, 2015 in PCT/US2014/63565 8 pages.

* cited by examiner

ENDPOINT DETECTION ALGORITHM FOR ATOMIC LAYER ETCHING (ALE)

RELATED APPLICATIONS

This application is based on and claims priority to co-pending U.S. Provisional Patent Application No. 62/382,904, entitled "ENDPOINT DETECTION ALGORITHM FOR ATOMIC LAYER ETCHING", filed on Sep. 2, 2016, the contents of which are incorporated, herein, in their entirety. This application is related to co-pending U.S. Nonprovisional patent application Ser. No. 15/053,368, entitled "METHOD OF ENDPOINT DETECTION OF PLASMA ETCHING PROCESS USING MULTIVARIATE ANALYSIS" (Ref. No. TTI-240US2-CON), filed on Feb. 25, 2016, which is a continuation of U.S. Nonprovisional patent application Ser. No. 14/056,059, entitled "METHOD OF ENDPOINT DETECTION OF PLASMA ETCHING PROCESS USING MULTIVARIATE ANALYSIS" (Ref. No. TTI-240), filed on Oct. 17, 2013, now U.S. Pat. No. 9,330,990, which is based on and claims priority to U.S. Provisional Patent Application No. 61/715,047, entitled "METHOD OF ENDPOINT DETECTION OF PLASMA ETCHING PROCESS USING MULTIVARIATE ANALYSIS" (Ref. No. TTI-240PROV), filed on Oct. 17, 2012, all of which applications are incorporated by reference, herein, in their entirety.

BACKGROUND

Atomic layer etching (ALE) is a plasma etch technology that enables layer-by-layer etching with atomic-scale precision. ALE implements a technique for removing thin layers of material using cycles of multi-steps that alternate, for example, between adsorption and desorption reactions. ALE is as an alternative to continuous etching and is viewed as an essential counterpart to atomic layer deposition.

Endpoint detection (EPD) is used to stop or change plasma etching processes by detecting that the material being etched has been cleared to an underlying layer. Depending on the types of materials being etched and the etch process parameters, a change of an optical emission spectrum of plasma at an endpoint of the etch process may be pronounced and relatively easy to detect, or conversely, subtle and relatively difficult to detect. For example, etching of the material with a low open ratio may make endpoint detection difficult using current algorithms for processing optical emission spectroscopy (OES) data. Improvements are therefore needed to make etch endpoint detection based on optical emission spectroscopy (OES) data more robust in such challenging etch process conditions.

BRIEF DESCRIPTION OF THE DRAWINGS

The detailed description is described with reference to accompanying figures. In the figures, the left-most digit(s) of a reference number identifies the figure in which the reference number first appears. The same numbers are used throughout the drawings to reference like features and components.

DETAILED DESCRIPTION

Described herein are architectures, platforms and methods for an endpoint detection of a process step or a combination of process steps in a multi-process step plasma etch processing system. The multi-process step processing system, for example, is an atomic layer etching (ALE) process and the ALE process may be represented by a continuous signal curve—as a detected or derived optical emission spectroscopy (OES) data—from the plasma etch processing system. In this example, the continuous signal curve (i.e., detected OES data) may include transient signals (e.g., spikes or noise in between process-steps) and accordingly, the continuous signal curve may further be synchronized, filtered, and averaged prior to performing of the endpoint detection as described herein.

In an implementation, the synchronized, filtered, and averaged continuous signal curve may further be delineated and/or identified to provide: a first quiescent portion, which may represent for example, an average of an absorption-step process of the multi-process step; and/or a second quiescent portion, which may represent, for example, an average of a desorption-step process of the multi-process step. In this implementation, the endpoint detection process may be based from the first quiescent portion alone, the second quiescent portion alone, or an average of the first and second quiescent portions. In other implementations, where the transients/noises are negligible in values, the endpoint detection may utilize directly the detected continuous signal curve. That is, the detected synchronized continuous signal curve or OES data with negligible transient signals.

As described herein, the first quiescent portion may represent an average of a filtered upper envelope (i.e., absorption-step process) of the continuous signal curve or OES data. On the other hand, the second quiescent portion may represent an average of a filtered lower envelope (i.e., desorption-step process) of the continuous signal curve or OES data.

The filtered upper envelope and filtered lower envelope denote removal of transient signals that may be present at the upper and lower envelope, respectively, of the OES data.

In an embodiment, the OES data are detected and acquired by a sensor from an etching process block and particularly, from a plasma processing chamber of the plasma etch processing system. The detection and acquisition by the sensor is synchronized, for example, with regard to initiation of the step-process (e.g., absorption or desorption step-process), and/or synchronized with cyclical switching of the multi-process steps (e.g., switching between absorption and desorption step-process) on the plasma processing chamber. In this example, the synchronization may be implemented by a hardware, software, or a combination of both.

With the synchronized OES data, the smoothening or filtering, averaging, and the endpoint detection may be subsequently performed. Particularly, the filtering of the transient signals may be performed by excluding, for example, identified period(s) or signal portion(s) where the transient signals are present. After the filtering of the transient signals, the averaging may be implemented by the use of a filter such as a moving average filter to generate the first quiescent portion, the second quiescent portion, or the average of both first and second quiescent portions.

Thereafter, based from the first quiescent portion, the second quiescent portion, or the average of both first and second quiescent portions, the endpoint detection may be determined using a principal component analysis (PCA) such as Fusion algorithm as described in the reference application (i.e., U.S. application Ser. Nos. 61/715,047, 14/056,059, and 15/053,368), or by using non-PCA method in other arts.

Figure 1:
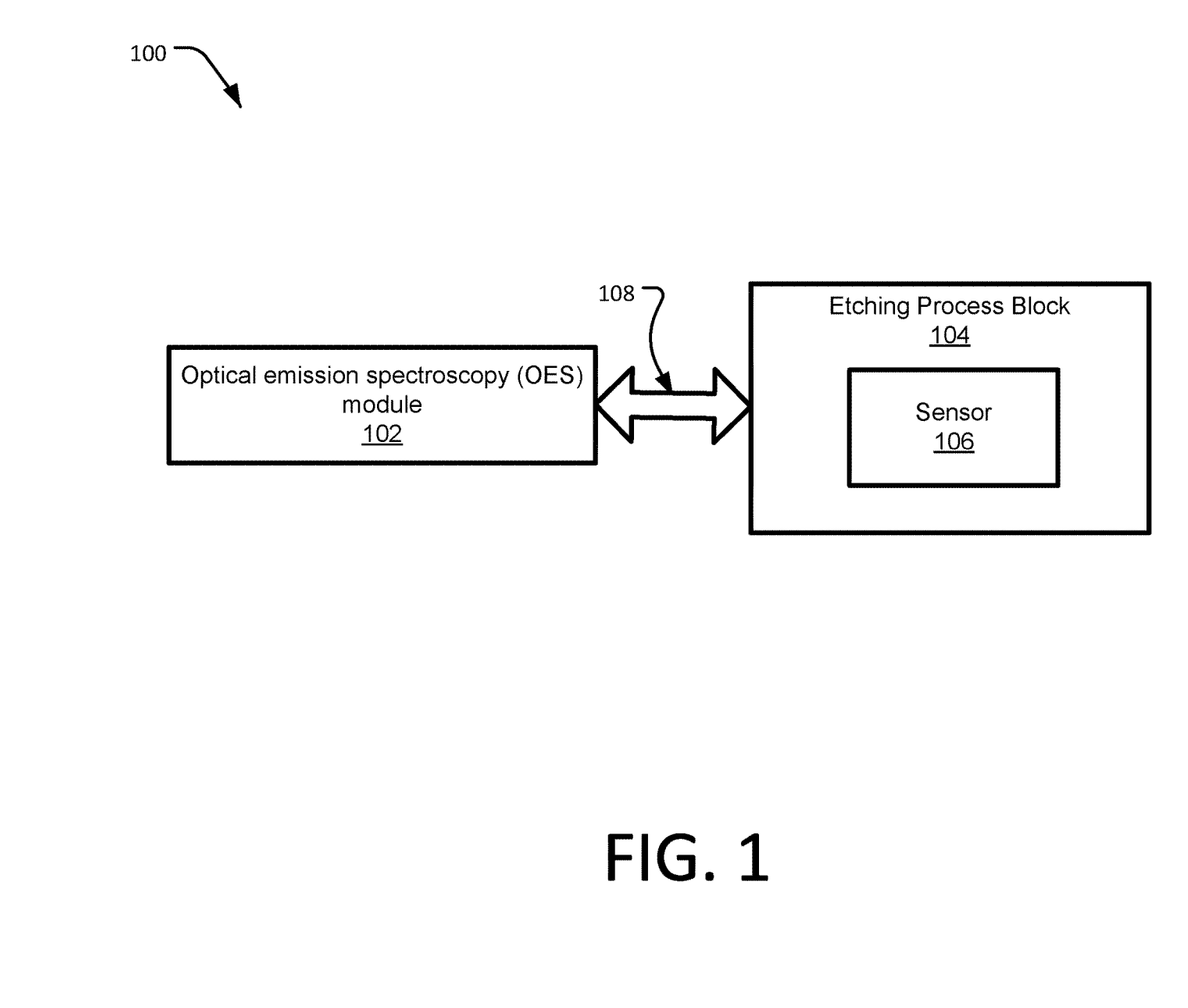
FIG. 1 is an example scenario that demonstrates an overview of an endpoint detection during an etching process as described in implementations herein.

FIG. 1 is an example scenario 100 that demonstrates an overview of an endpoint detection during an etching process as described in embodiments herein. The scenario 100 may be a plasma processing system or any other type of etching system that utilizes a cyclically repeated multi-step plasma process such as the ALE process.

As shown, an OES module 102 may be connected to an etching process block 104 through a wired or a wireless connection 108. The etching process block 104 is simplified herein as a block mechanism that performs a plasma etching or any other process that is a plasma based process. Furthermore, the etching process block 104 may include a sensor 106 that detects and acquires, for example, the OES data (or continuous signal curve) during an etching process operations in the etching process block 104. In this example, the sensor 106 transmits the acquired data to the OES module 102 for further processing.

As described herein, the acquisition of the OES data by the sensor 106 may be synchronized with the etching process performed by the etching process block 104. The reason being, the endpoint detection is cognizant of particular time or period when a process-step (such as absorption-step process) is shifted or switched to another process-step (such as desorption-step process), or vice-versa. In this regard, the endpoint detection is cognizant of the particular time or period in two ways: first, by directly receiving the OES data through a hardware component; and second, by using a software configured to recognize the transient signals, filter the transient signals, and provide the averaged first and second quiescent portions as further discussed below.

With continuing reference to FIG. 1, the processing by the OES module 102, for example, may include receiving of the acquired OES data through a transceiver component (not shown), synchronization of the received OES data, filtering or cutting-off of the transient signals that may be present in the received OES data, average—determinations (e.g., use of moving average filter) of each process steps in the cyclically repeated multi-step plasma process, and application of an algorithm (e.g., Fusion Algorithm) to determine the endpoints of the smoothened OES data. In this example, the OES module 102 may be implemented in any suitable hardware, software, firmware, or a combination thereof, without departing from the scope of the invention. Furthermore, the OES module 102 may be directly coupled or integrated, for example, to the plasma processing chamber of the plasma processing system such as the etching process block 104.

The etching process block 104 may utilize a plasma-based processing system that includes for example, the ALE process. The ALE process may include a multi-step process (i.e., represented by a continuous signal curve) that may be further delineated into a cyclically repeated absorption-step (i.e., upper envelope of the continuous signal curve), and a cyclically repeated desorption-step (i.e., lower envelope of the continuous signal curve). In this example, the sensor 106, which is connected to the etching process block 104, may detect and acquire the multi-step process data (i.e., OES data) from the plasma processing chamber of the plasma processing system that is implemented by the process block 104. With the acquired OES data, the sensor 106 may transmit the acquired OES data to the OES module 102 through the wired or a wireless connection 108.

The OES module 102 may include a transceiver (not shown) to receive the acquired OES data through the sensor 106. In an implementation, the OES module 102 may be configured to facilitate synchronization in the acquisition of the OES data. For example, the sensor 106 is synchronized with operations of the etching process block 104 in order to synchronize OES data sampling acquisition with respect to the cyclical switching of process steps of the cyclical multi-step plasma process on the etching process block 104.

Furthermore, the OES module 102 may be configured to synchronize the plasma step—processes of the OES data, facilitate filtering of transient signals on the synchronized OES data (or may be referred to as ALE process signals), facilitate averaging of the filtered OES data, and lastly, facilitate the determination of endpoints of the smoothened ALE process signals or OES data.

As described herein, the synchronization, filtering, and the like, of the OES data may be referred to as smoothing of data prior to analysis or determination of the endpoints. Furthermore, the endpoint detections may utilize the methods described in the cross referenced related application. Particularly, the Fusion Algorithm may be applied based from each step process (i.e., first quiescent portion or second quiescent portion) in the multi-step plasma process, or based from an average of at least two step-processes (i.e., average of the first and second quiescent portions) of the multi-step plasma process as further discussed below.

Furthermore, the OES module 102 may be configured to output control parameters based from the processed OES data. The output control parameters, for example, may be utilized by the etching process block 104 for parameter adjustments during the plasma processing system operations. For example, the OES data sampling acquisition by the sensor 106 may require synchronization with respect to the cyclical switching of process steps of the cyclical multi-step plasma process. In other words, the sensor 106 may receive the output control parameters for adjustments of OES data acquisition with respect to the cyclical switching of process steps of the cyclical multi-step plasma process.

In acquiring the OES data, the sensor 106 may include, for example, a spectrometer that measures a spectrum (i.e., OES data) of the plasma processing system in the etching process block 104. The spectrum, in this example, may include light intensity as a function of wavelength or frequency. The sensor 106 may not be limited to a spectrometer as other light detectors may be utilized to measure the light intensity at the plasma processing chamber of the plasma processing system.

Although the embodiments described herein refer to the plasma processing system as a source of data to be synchronized, filtered, etc., other etching processing systems may be utilized in the etching process block 104 and the same processing as described herein may be applied in order to make the signals more robust prior to the endpoints determination.

Figure 2:
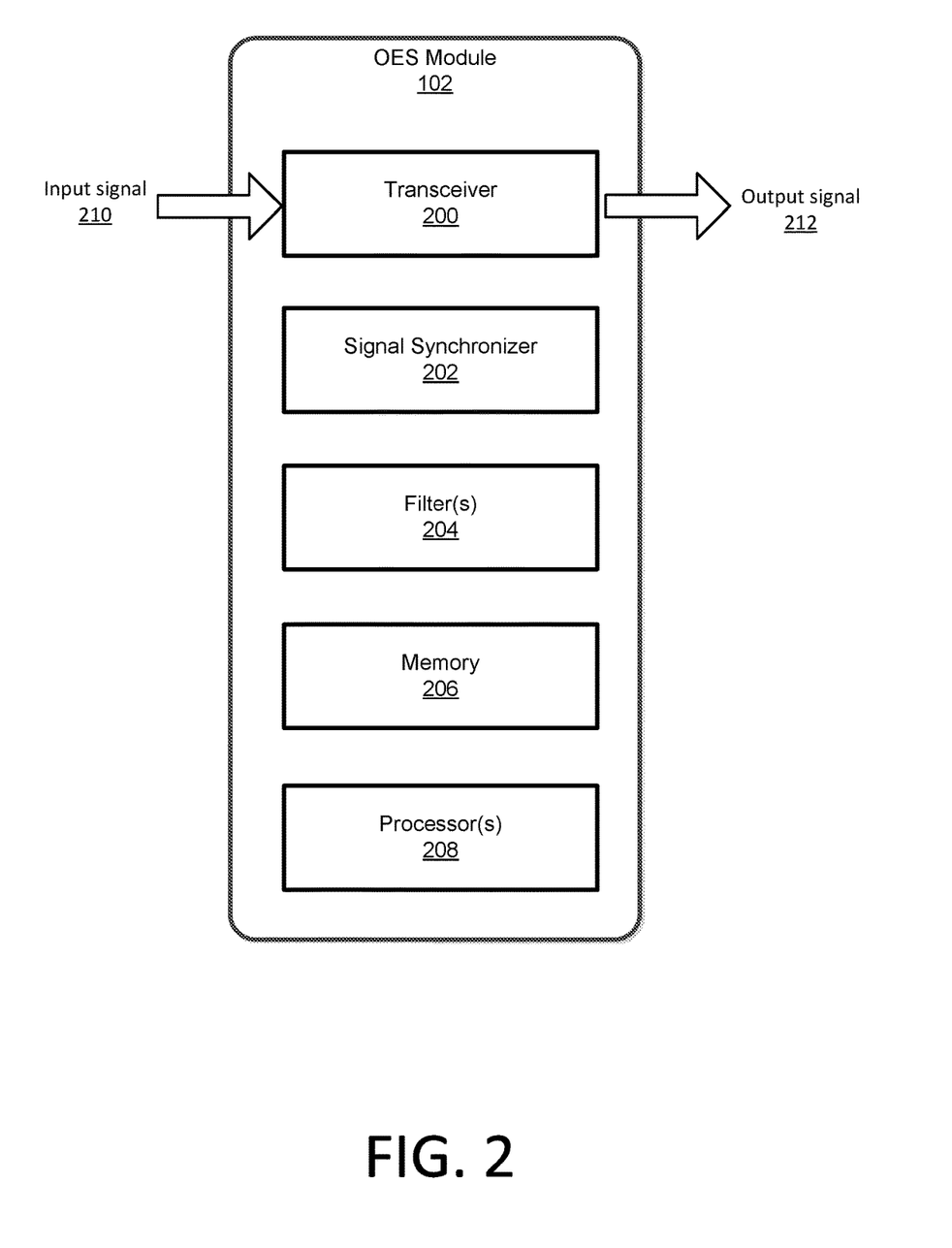
FIG. 2 is an exemplary schematic block diagram of an optical emission spectroscopy (OES) module as described in implementations herein.

FIG. 2 is an exemplary schematic block diagram of the OES module 102 as described in present implementations herein. As shown, the OES module 102 may include a transceiver 200, a signal synchronizer 202, a filter 204, a memory 206, and a processor 208. The OES module 102 further shows an input signal 210 and an output signal 212. Although the OES module 102 is being implemented by hardware components such as the signal synchronizer 202, filter 204, and the memory 206, the processor 208 may be configured to implement software algorithm to perform functions of these hardware components.

For example, the software algorithm may perform: synchronization of the signal detection and acquisition (i.e., acquisition of continuous signal curve or OES data) by the sensor 106, and synchronization of multi-process steps (e.g., absorption and desorption-step processes) of the OES data. Furthermore, the software algorithm may perform: detecting, identifying, and filtering of transient signals of the OES data; determining and averaging the filtered OES data to generate a first quiescent portion (e.g., absorption—step process) of the filtered OES data; and determining and averaging the filtered data to generate a second quiescent portion (e.g., desorption-step process) of the filtered OES data.

Furthermore still, the software algorithm may perform: endpoint detections based from the average of the absorption-step process (i.e., first quiescent portion), or based from the average of the desorption-step process (i.e., second quiescent portion), or based from an average of combined absorption and desorption-step process averages (i.e., average of the combined first and second quiescent portions). In addition, the software algorithm may perform the endpoint detection based on a raw average of the detected continuous signal curve or OES data in case of absence of transient signals (i.e., negligible transient signals). The raw average, in this implementation, denotes non-exclusion or non-filtering of the negligible transient signals that are present in the acquired OES data.

With continuing reference to FIG. 2, the transceiver 200 may include a circuitry, software, or a combination thereof, that receives the input signal 210 such as the continuous signal curve or OES data (during plasma processing system) from the sensor 106. The receiving and the transmitting by the transceiver 200 may be performed within a particular pre-determined time period, or in a continuous manner as may be configured. The transceiver 200 may be further configured to transmit the output signal 212 (e.g., output control parameters) to synchronize and control signal acquisition of the OES data by the sensor 106, and to further synchronize and control operations of the etching process block 104 such as the manner or timing of switching plasma processing conditions. For example, the detection and acquisition of the OES data by the sensor 106 is synchronized with the at least two process steps that are cyclically repeated by the etching process block 104. In this example, the output signal 212 may facilitate the necessary control parameters to synchronize operations of the sensor 106 and the etching process block 104.

As an alternative to the hardware components in the foregoing example, the software algorithm may perform the synchronization of the OES data. For example, the processor 208 may implement the software algorithm that identify portions of the continuous signal curve that may represent: the absorption-step process; the desorption-step process; the transient signal portions; and other changes in conditions on the OES data.

In an implementation, the input signal 210 that is to be synchronized, filtered, and averaged may provide different aspects for the endpoint detection. For example, the aspects include an average of the absorption-step alone (i.e., first quiescent portion), an average of the desorption-step alone (i.e., second time-dependent optical signal portions), a combination of the absorption-step and the desorption-step within a particular time period, a combination of the absorption-step within a first time period and the desorption-step within a second different time period, and different other combinations. In this example, the software algorithm may perform the endpoint detection based on the particular aspect of the input signal 210. Furthermore, the endpoint detection for each aspect may be compared to derive the best possible aspect of the signal 210 to process for purposes of endpoint detection.

For example, the OES module 102 is configured to determine endpoints of the plasma processing system based upon the first quiescent portion (i.e., absorption-step process). In this example, the sensor 106 may be configured to acquire OES data and particularly, to acquire the OES data on the cyclically repeated absorption-step process. That is, the sensor 106 may be configured to detect increase or decrease in cycle time, transient signals within a time period, increase in adsorption rate constants for reactions in a plasma chlorination, operating temperature, and the like. These parameters (i.e., operating temperature, increase or decrease in cycle time, etc.) may be represented by an absorption intensity signal and received as the input signal 210 by the transceiver 200 for further processing by the signal synchronizer 202, filter(s) 204, and the processor 208 for endpoint determinations.

In another example, the OES module 102 OES module 102 is configured to determine endpoints of the plasma processing system based upon a combination of the cyclically repeated multi-step process such as the combination of the time-dependent absorption and desorption-step signals. In this example, the sensor 106 may be configured to acquire the OES data related to the cyclically repeated absorption and desorption-step processes. That is, the sensor 106 may be configured to detect: increase or decrease in respective cycle times of the cyclical absorption and desorption-step processes; transient signals within a time period due to switching of plasma process gases and other plasma processing conditions associated with switching of process steps in the cyclically repeated multi-step plasma process; increase in adsorption and/or desorption rate constants for reactions in a plasma chlorination, temperature; and the like.

In the foregoing examples, the detected parameters (i.e., temperature, increase or decrease in cycle time, etc.) may be represented by a single continuous signal curve or OES data. In an embodiment, the hardware components (i.e., signal synchronizer, filter, etc.), or the software algorithm, or the combination thereof, may delineate and calculate the average of the absorption-step process (i.e., first quiescent portion), and the average of the desorption-step process (i.e., second quiescent portion) of the single continuous signal curve or OES data.

As described herein, the signal synchronizer 202 may be configured to implement synchronization by sending the output signal 212 to the etching process block 104 and/or the sensor 106. For example, the synchronization of the at least two cyclically repeated process steps may include adjustments of their respective cycle times, adjustments of their respective sampling frequency intervals, operating temperature, increase or decrease in the adsorption and/or desorption rate constants for reactions in the plasma chlorination, and the like. In this example, the synchronization may establish a particular reference point or sequence to harmonize or synchronize the input signal 210 prior to processing by the filter 204.

In another example, the signal synchronizer 202 may facilitate synchronized acquisition of the OES data and switching of plasma processing conditions in order for OES signal sampling to occur with precise timing with respect to the cyclical switching of the process steps (i.e., absorption-step process to desorption-step process, and vice-versa) of the cyclical multi-step plasma processes.

In a case where the signal synchronizer 202 may not be able to implement synchronization of the at least two cyclically repeated process steps due to an error in the input signal 210, the processor 208 may be configured to facilitate correction of the error in the input signal 210 by sending the necessary output signal parameters to the sensor 106.

For a single cyclically repeated step process (i.e., absorption-step process or desorption-step process), the signal synchronization may not be performed (i.e., bypassed) and the single cyclically repeated step process (i.e., input signal 210) may undergo transient signal filtering prior to the endpoint detection that is performed through an application of the Fusion Algorithm or a principal component analysis (PCA), or any other type of non-PCA methods.

As described herein, the Fusion Algorithm in the cross-referenced related application is adopted with regard to independent endpoint determination of the single cyclically repeated process. Furthermore, the Fusion Algorithm may also be utilized for endpoint determinations for the multi-step processes of the received OES data.

After obtaining the synchronized at least two cyclically repeated process steps from an output of the signal synchronizer 202, the filter(s) 204 may be configured to cut-off transient signals that may occur during cyclical switching of the plasma system from absorption—step process to desorption—step process, and vise-versa.

For example, the transient signals may be detected to occur at the beginning of each sampling interval or after every time period within a spectrum of the received OES data. In another example, the transient signals may be detected when the adsorption or desorption intensity light signal is above a pre-determined threshold. In these examples, the filter 204 may be configured to remove the transient signals at the beginning of each sampling interval, or in case of using the pre-determined threshold, when the detected transient signals is above the threshold value. The threshold value, in this case, defines presence of the transient signals.

With the removal or minimization of the transient signals, the filtered adsorption intensity light signal may further undergo another filtering process as further discussed below. Similarly, with regard to the desorption intensity light signal, the same procedure as discussed in the foregoing (e.g., use of threshold) may be applied to cut off the transient signals from the desorption intensity light signals.

After the removal of the transient signals from the adsorption and/or desorption intensity light signals, the filter 204 may be configured to perform another algorithm or apply a filter response function (e.g., moving average filter) to average the filtered OES data. The moving average filter, in this case, may smooth data by replacing each data point with an average of neighboring data points defined within a particular span. Furthermore, the moving average filter may produce: the first quiescent portion, the second quiescent portion, or the average of the first and second quiescent portions as further discussed in FIG. 3 below.

After the smoothing and averaging of the adsorption and/or desorption intensity light signals, the endpoints are detected by Fusion Algorithm. The endpoint determinations in the cross-referenced related application is adopted herein as may be applicable.

The one or more processors 208 may be a single processing unit controller or a number of processing unit controllers, all of which may include single or multiple computing units or multiple cores. The processor(s) 208 may be implemented as one or more microprocessors, microcomputers, microcontrollers, digital signal processors, central processing units, state machines, logic circuitries, and/or any devices that may manipulate the cyclically multi-step process signals based on operational instructions. Among other capabilities, the processor(s) 208 may be configured to fetch and execute computer-readable instructions or processor-accessible instructions stored in the memory 206 or other computer-readable storage media. For example, the processor(s) 208 may be configured to determine endpoint determination of the absorption—step process, the desorption—step process, or based from the combinations or average of both.

The memory 206 is an example of non-statutory computer-readable storage media for storing instructions which are executed by the processor(s) 208 to perform the various functions described herein. For example, the memory 206 may generally include both volatile memory and non-volatile memory (e.g., RAM, ROM, or the like). Memory 206 may be referred to as memory or computer-readable storage media herein. Memory 206 is capable of storing computer-readable, processor-executable program instructions as computer program code that may be executed by the processor(s) 208 as a particular machine configured for carrying out the operations and functions described in the implementations herein.

Memory 206 may further store one or more applications (not shown) for endpoint determinations as described herein. The applications may include preconfigured/installed and downloadable applications. In addition, memory 206 may store the OES data that undergo processing for endpoint determinations as described herein. For example, the memory 206 stores output of the signal synchronizer 202, filter(s) 204, etc.

Figure 3:
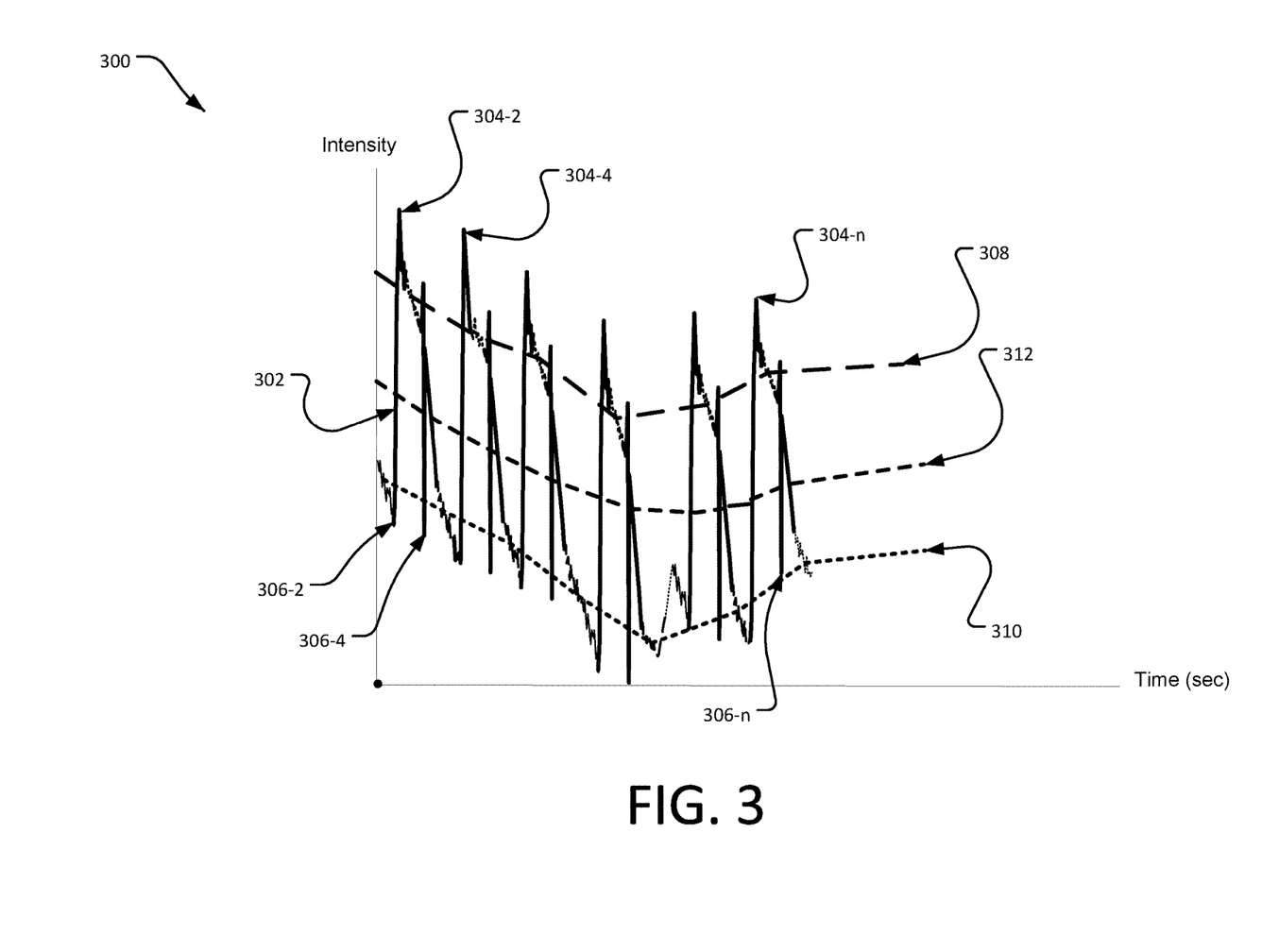
FIG. 3 is an example graph representation of an input signal that is processed by an OES module as described in implementations herein.

FIG. 3 is an example graph representation of OES data 300 that is collected and processed by the OES module as described herein. The OES data 300 may include a single continuous signal curve 302 with different amount of light intensity over a time period or cycle. The amount of light intensity is shown by vertical "Y"-axis and over the time period, which may be represented by horizontal "X"-axis. Furthermore, an upper envelope and a lower envelope of the single continuous signal curve 302 may represent the cyclical multi-step processes such as the absorption-step process and the desorption-step process, respectively.

The single continuous signal curve 302 further includes transient signals 304-2, 304-4, . . . 304-n that may be present at the upper envelope, which represents the absorption-step process of the single continuous signal curve 302. Similarly, transient signals 306-2, 306-4, . . . 306-n may be present at the lower envelope that represents the desorption-step process of the single continuous signal curve 302. These transient signals 304 and 306 may represent noise, spikes, or unnecessary signals that may periodically occur during cyclical switching of the multi-step plasma process, or over a particular time duration in the cycle.

In an embodiment, the filter 204 may be configured to cut-off or remove the transient signals 304 and 306 to smoothen the single continuous signal curve 302 prior to averaging by the filter 204 (e.g., application of moving average filter). For example, the processor 208 may detect the transient signals 304 and 306 to occur within a particular time period from the beginning of each cyclical switching step-process. In this example, the filter 204 may cut-off portions of the single continuous signal curve 302 that fall within the particular time period in the cycle. In another example, the processor 208 may use the pre-determined threshold value to detect presence of the transient signals 304 and 306. In this other example, the filter 204 may cut-off portions of the single continuous signal curve 302 that are above the pre-determined threshold value, which indicates presence of the transient signals.

After the removal of the transient signals 304 and 306, the filter 204 may apply, for example, the moving average filtering to calculate the averages of the remaining upper envelope and the remaining lower envelope of the single continuous signal curve 302. As shown in FIG. 3, the average of the remaining upper envelope that represents the absorption-step process may be referred to as a first quiescent portion 308, while the average of the remaining lower envelope that represents the desorption-step process may be referred to as a second quiescent portion 310.

In an embodiment, the first quiescent portion 308 includes the average of the signal portions of the absorption-step process after the removal the transient signals 304. Similarly, the second quiescent portion 310 includes the average of the signal portions of the desorption-step process after the removal the transient signals 306. Furthermore, FIG. 3 shows an average signal 312 that may represent a calculated average of the combined first quiescent portion 308 and the second quiescent portion 310.

In another implementation, in a case where transient signals 304 and 306 are negligible in values, the first quiescent portion 308 and second quiescent portion 310 may be directly calculated without the need of filtering the transient signals 304 and 306. In this other implementation, the average signal 312 may be based directly from the received single continuous signal curve 302.

Referring to the OES module 102 in FIG. 2 above, the OES module 102 may perform endpoint detections based from: first quiescent portion 308; the second quiescent portion 310; and/or the average signal 312. With reference to the endpoint detections, the Fusion Algorithm in the crossed-reference related application may be utilized to determine endpoints of the OES data 300.

Figure 4:
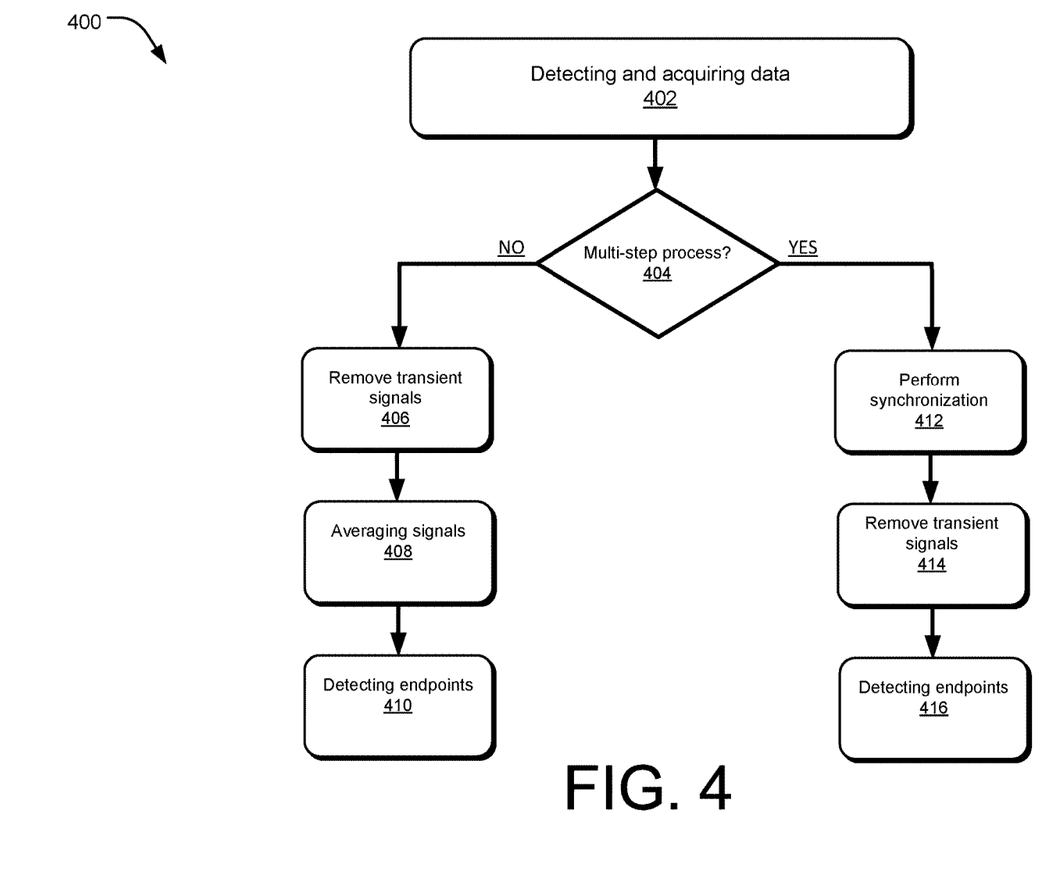
FIG. 4 is an example process chart illustrating an example endpoint detection of multi-process steps in a plasma etch processing system.

FIG. 4 shows an example process 400 for endpoint detection of the cyclically repeated multi-process steps in a plasma etch processing system. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At block 402, detecting and acquiring data is performed. For example, for the plasma processing system, a light detection device (i.e., sensor 106) may be utilized to acquire optical emission spectroscopy (OES) data (e.g., OES data 300) from a set of one or more plasma etch process runs. As further discussed in the cross-referenced application, a spectra may be acquired n times during each etch plasma etch process run, where n is an integer greater than 1. The sampling interval between successive OES data acquisitions (i.e., spectra acquisitions) may vary from 0.01 to 1.0 seconds. Each acquired OES data set, i.e., spectrum, may include m measured light intensities corresponding to m pixels of a CCD (charge coupled device) light detection device, and each pixel of the m pixels may correspond to a certain light wavelength projected upon the pixel by a diffraction grating which is typically employed as the light dispersion device in the sensor 106.

In the foregoing example, the acquired OES data 300 may be received by the OES module 102 through the transceiver 200.

At block 404, determining whether the OES data includes a multi-step process.

If condition at block 404 is a single-step process i.e., absorption-step process alone or desorption-step process alone, then following the "NO" branch of block 406, removal of transient signals of the absorption or desorption-step process may be applied prior to the application, for example, of the moving average filter at block 408. The averaging of signals at block 408 generates the first quiescent portion 308, the second quiescent portion 310, and/or the average signal 312, which is the average of the combined first and second quiescent portions.

At block 410, detecting endpoints is performed. For example, endpoint determination may be based from the first quiescent portion 308, the second quiescent portion 310, and/or the average signal 312.

If condition at block 404 is a multi-step process, then following the "YES" branch of block 412, a synchronization of the received OES data (e.g., OES data 300) may be performed by the signal synchronizer 202.

At block 414, removal of transient signals is performed. For example, the filter 204 cuts off the detected transient signals 304 and 306 of the single continuous signal curve 302.

At block 414, detecting endpoints of the multi-step process is performed. For example, the Fusion Algorithm as described in the cross-referenced application may be utilized to detect endpoints. In another example, other prior art endpoint detections may be utilized as well. In these examples, the endpoint detection is based from: first quiescent portion 308, the second quiescent portion 310, and/or the average signal 312, which is the average of the combined first and second quiescent portions.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the various configurations may be implemented as a combined structure or component. These and other variations, modifications, additions, and improvements may fall within the scope of the invention as defined in the claims that follow.

Figure 5:
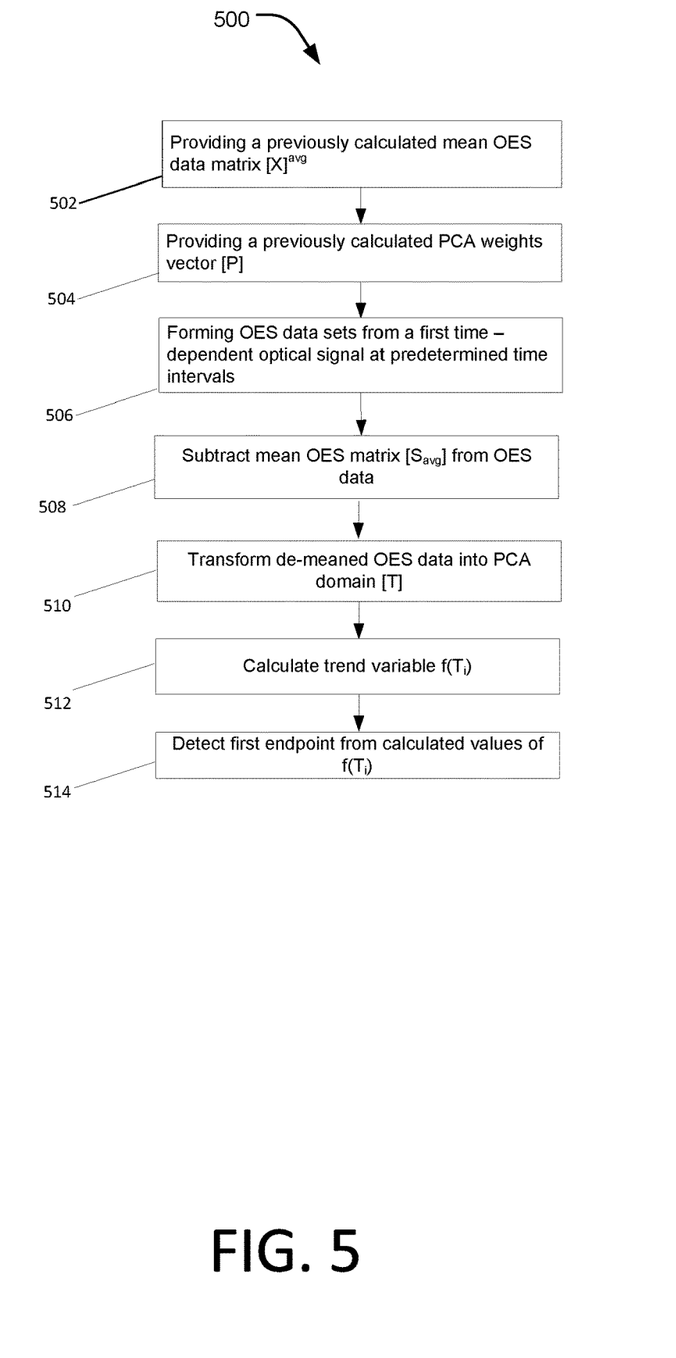
FIG. 5 is an example process chart illustrating an example endpoint detection as described herein.

FIG. 5 shows an example process 500 for endpoint detection of cyclically repeated multi-process steps in a plasma etch processing system as described herein. The example endpoint detection below is based from the cross-referenced application and as such, the Reader may look on the cross-referenced application for further discussion and explanations of the blocks 502-514. Furthermore, the endpoint detection may be applied to the first quiescent portion 308, the second quiescent portion 310, or the average (i.e., average signal 312) of the first and second quiescent portions. Furthermore still, any other method in the art may be applied to detect the endpoints as described herein. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At block 502, providing a previously-calculated and stored mean optical emission spectroscopy (OES) data matrix $[S_{avg}]$ is performed.

At block 504, providing a previously-calculated and stored principal component weights vector [P] is performed.

At block 506, forming optical emission spectroscopy (OES) data sets from a process-step at predetermined time intervals during the cyclical multi-step plasma process is performed.

At block 506, and from each optical emission spectroscopy (OES) data set, subtracting the previously provided mean optical emission spectroscopy (OES) data matrix $[S_{avg}]$, to de-mean each optical emission Spectroscopy (OES) data set.

At block 508, transforming each de-meaned and non-normalized optical emission spectroscopy (OES) data set into transformed optical emission spectroscopy (OES) data, by calculating at least one element of the transformed optical emission spectroscopy (OES) data vector [T] using the provided principal component weights vector [P].

At block 510, and from the calculated at least one element of the transformed optical emission spectroscopy (OES) data vector [T], further calculating a trend variable $f(T_i)$ is performed.

At block 512, detecting the first endpoint of the cyclical multi-step plasma process from the calculated values of the trend variable $f(T_i)$ during the cyclical multi-step plasma process is performed.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the various configurations may be implemented as a combined structure or component. These and other variations, modifications, additions, and improvements may fall within the scope of the invention as defined in the claims that follow.

What is claimed is:

1. A method for determining process endpoint data in a plasma processing system, comprising:
  receiving optical emission spectroscopy (OES) data from a plasma processing chamber of the plasma processing system that performs a multi-step plasma process of a substrate that is an atomic layer etch (ALE) process, wherein the multi-step plasma process is cyclical and comprises at least two process steps that are cyclically repeated, and the at least two process steps comprise an absorption step and a desorption step;
  determining a first quiescent portion of the received OES data, the first quiescent portion is an average of the absorption step of the ALE process;
  determining a second quiescent portion of the received OES data, the second quiescent portion is an average of a desorption step of the ALE process; and
  determining a first endpoint of the determined first quiescent portion.

2. The method of claim 1, wherein the at least two process steps includes a transient signal—filtered absorption step or a transient signal—filtered desorption step.

3. The method of claim 1, wherein the receiving of optical emission spectroscopy (OES) data is synchronized with the at least two process steps that are cyclically repeated.

4. The method of claim 1, further comprising:
  removing transients associated with switching the at least two process steps prior to the determining of the first quiescent portion.

5. The method of claim 1, wherein the first quiescent portion is derived from an upper envelope of the OES data acquired.

6. The method of claim 1, further comprising:
  determining an average of the first quiescent portion and the second quiescent portion.

7. The method of claim 6, wherein the determining of the first endpoint is based from the determined second quiescent portion.

8. The method of claim 6, wherein the determining of the first endpoint is based from the average of the first quiescent portion and the second quiescent portion.

9. The method of claim 1, wherein the determining the first quiescent portion comprises an application of a moving average filter to the at least two process steps.

10. The method of claim 1, further comprising:
  removing transient signals of the received OES data prior to the determining of the first endpoint based on a second quiescent signal.

11. The method of claim 10, wherein determining a second endpoint based on the second quiescent data comprises a principal component analysis.

12. The method of claim 1, wherein determining of the first endpoint comprises a principal component analysis.

13. A method for determining process endpoint data in a plasma processing system, comprising:
  receiving optical emission spectroscopy (OES) data from a plasma processing chamber of the plasma processing system that performs a multi-step plasma process of a substrate, wherein the multi-step plasma process is cyclical and comprises at least two process steps that are cyclically repeated;
  determining a first quiescent portion of the received OES data, the first quiescent portion is an average of a filtered process-step of the multi-step plasma process; and
  determining a first endpoint of the determined first quiescent portion,
  wherein determining the first endpoint comprises:
    providing a previously-calculated and stored mean optical emission spectroscopy (OES) data matrix $[S_{avg}]$;
    providing a previously-calculated and stored principal component weights vector [P];

forming optical emission spectroscopy (OES) data sets from a first quiescent signal at predetermined time intervals during the cyclical multi-step plasma process;

from each optical emission spectroscopy (OES) data set, subtracting the previously provided mean optical emission spectroscopy (OES) data matrix $[S_{avg}]$, to de-mean each optical emission spectroscopy (OES) data set;

transforming each de-meaned and non-normalized optical emission spectroscopy (OES) data set into transformed optical emission spectroscopy (OES) data, by calculating at least one element of the transformed optical emission spectroscopy (OES) data vector [T] using the provided principal component weights vector [P];

from the calculated at least one element of the transformed optical emission spectroscopy (OES) data vector [T], further calculating a trend variable $f(T_i)$; and detecting the first endpoint of the cyclical multi-step plasma process from the calculated values of the trend variable $f(T_i)$ during the cyclical multi-step plasma process.

\* \* \* \* \*